(12) United States Patent
Guha et al.

(10) Patent No.: US 7,479,684 B2
(45) Date of Patent: Jan. 20, 2009

(54) FIELD EFFECT TRANSISTOR INCLUDING DAMASCENE GATE WITH AN INTERNAL SPACER STRUCTURE

(75) Inventors: Supratik Guha, Chappaqua, NY (US); Hussein I. Hanafi, Basking Ridge, NJ (US); Rajarao Jammy, Wappingers Falls, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 10/979,633

(22) Filed: Nov. 2, 2004

(65) Prior Publication Data

US 2006/0091432 A1 May 4, 2006

(51) Int. Cl.
*H01L 29/94* (2006.01)

(52) U.S. Cl. .................. 257/410; 257/288; 257/401; 257/E29.242

(58) Field of Classification Search .......... 257/288, 257/401, 410, E29.242
See application file for complete search history.

(56) References Cited

U.S. PATENT DOCUMENTS

| | | | | |
|---|---|---|---|---|
| 5,811,340 | A * | 9/1998 | Park | 438/291 |
| 5,963,818 | A | 10/1999 | Kao et al. | |
| 6,180,477 | B1 * | 1/2001 | Liao | 438/305 |
| 6,225,173 | B1 * | 5/2001 | Yu | 438/301 |
| 6,258,679 | B1 | 7/2001 | Burns et al. | |
| 6,333,247 | B1 | 12/2001 | Chan et al. | |
| 6,451,639 | B1 | 9/2002 | Jang et al. | |
| 6,504,210 | B1 | 1/2003 | Divakaruni et al. | |
| 6,746,900 | B1 * | 6/2004 | Liu et al. | 438/142 |
| 6,787,827 | B2 * | 9/2004 | Inumiya et al. | 257/288 |
| 2002/0045332 | A1 | 4/2002 | Jang et al. | |
| 2002/0058372 | A1 | 5/2002 | Jang et al. | |
| 2002/0064964 | A1 | 5/2002 | Jang et al. | |
| 2002/0119637 | A1 | 8/2002 | Bertin et al. | |

FOREIGN PATENT DOCUMENTS

WO WO 02/27799 A2 4/2002
WO WO 02/065524 A1 8/2002

OTHER PUBLICATIONS

Bruel et al., Jpn. J. Appl. Phy., "Smart Cut: a new silicon on insulator material technology based on hydgrogen implantation and wafer bonding," 36(1997) 1636-1641.

* cited by examiner

*Primary Examiner*—Evan Pert
*Assistant Examiner*—Eduardo A Rodela
(74) *Attorney, Agent, or Firm*—Scully, Scott, Murphy & Presser, P.C.; Ido Tuchman, Esq.

(57) ABSTRACT

A MOSFET is disclosed that comprises a channel between a source extension and a drain extension, a dielectric layer over the channel, a gate spacer structure formed on a peripheral portion of the dielectric layer, and a gate formed on a non-peripheral portion of the dielectric layer, with at least a lower portion of the gate surrounded by and in contact with an internal surface of the gate spacer structure, and the gate is substantially aligned at its bottom with the channel.

20 Claims, 5 Drawing Sheets

FIELD EFFECT TRANSISTOR INCLUDING DAMASCENE GATE WITH AN INTERNAL SPACER STRUCTURE

FIELD OF THE INVENTION

The invention relates to a MOSFET device having a damascene gate with an internal spacer structure and a process of forming the device.

BACKGROUND OF THE INVENTION

In order to extend CMOS scaling, dielectrics of higher dielectric constant (Hi-K) are being investigated. For a given gate capacitance, hence charge in the channel, the Hi-K dielectric can be thicker, thus reducing tunneling leakage. To increase the gate capacitance even further, and to have a suitable work-function for thin-silicon implementation, a metal gate is desirable. These material options are frequently incompatible with conventional high-temperature front end of the line processing, so that replacement gate methods are being tried where the Hi-K dielectric and the metal are deposited in a groove formed by removing a dummy gate.

As the gate length of a field effect transistor (FET) gets shorter, the Hi-K dielectric occupies an increasing fraction of the groove. The gate itself tends to be rounded at the bottom, and as a result, only the center of the gate has full control of the channel. Furthermore, the presence of a gap between the Source/Drain (S/D) extension implant regions and the gate edge increases the on-resistance of the FET. Therefore, there is a need for alternate methods of forming a device with better overlap or alignment between the gate and S/D extensions as well as gate contact profile for improved device performance.

SUMMARY OF THE INVENTION

The invention relates to a MOSFET with improved device performance and method of fabricating the device. The MOSFET comprises a source extension, a source contact disposed on the source extension, a drain extension, a drain contact disposed on the drain extension, a channel between the source extension and the drain extension, a dielectric layer above the channel, a gate spacer structure disposed on a peripheral portion of a top surface of the dielectric layer and having an internal surface that meets the top surface of the dielectric layer at about a right angle. A gate, which is disposed over a non-peripheral portion of the top surface of the dielectric layer, has at least a lower portion surrounded by and in contact with the internal surface of the gate spacer structure. The gate is also substantially aligned at its bottom with the channel.

DESCRIPTION OF THE DRAWINGS

Embodiments of the invention are depicted in the drawings and described in detail below by way of examples.

FIG. 1 depicts a cross-sectional view of a substrate with a bottom insulator, a channel layer and a protection layer;

FIG. 2 illustrates the formation of a dummy gate over the structure of FIG. 1;

FIG. 3 illustrates the formation of a channel, dummy gate spacers and isolating spacer structure from the structure of FIG. 2;

FIG. 4 illustrates a first overlayer and a second overlayer formed over the structure of FIG. 3;

FIG. 5 illustrates the structure of FIG. 4 after planarization to the dummy gate;

FIG. 6 illustrates the structure after removing the dummy gate and dummy gate spacer;

FIG. 7 illustrates the structure of FIG. 6 with isolating spacers;

FIG. 8 illustrates the formation of a dielectric layer and gate spacers;

FIG. 9 illustrates the formation of a gate contact;

FIGS. 10-12 illustrate an alternative process sequence of forming a dielectric layer at the bottom of a gate contact;

FIG. 13 illustrates an enlarged cross sectional view of the device of FIG. 9;

FIG. 14 illustrates a cross-sectional view of an alternative device structure.

Figure 1:
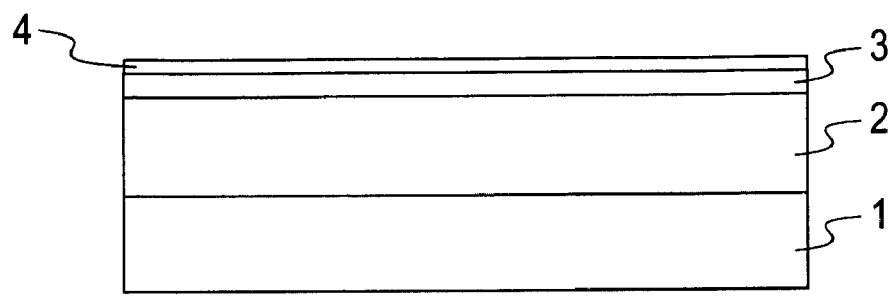
FIGS. 1-14 depict structures obtained during various stages of the fabrication process.

The figures are meant for illustrative purpose and thus, not shown in real dimensions or drawn to scale.

DETAILED DESCRIPTION OF THE INVENTION

The present invention will now be described in more detail by referring to the drawings that accompany the present application. In the accompanying drawings, like reference numerals are used for describing like and corresponding elements.

FIG. 1 shows an initial stacked structure that comprises a substrate 1 having a bottom insulator 2, also referred to as buried oxide layer, located thereon. The initial stacked structure also includes a channel layer 3 on top of the bottom insulator 2, and an oxide layer 4, also referred to as pad protection layer, located atop the channel layer 3.

The structure shown in FIG. 1 can be manufactured from conventional materials with conventional processing steps that are well known in the art. For example, the substrate 1 may comprise any semiconducting material including, but not limited to: Si, Ge, SiGe, GaAs, InAs, InP and all other III/V semiconductor compounds, and may also be a layered substrate comprising different semiconductor materials, e.g., Si/SiGe. The illustrative embodiment of FIG. 1 shows a silicon-on-insulator (SOI) structure, where the channel layer 3 is provided over a buried oxide layer 2. For embodiments with a buried oxide layer 2, substrate 1 may also be any materials (e.g., not restricted to semiconducting) as long as it provides adequate support for layer 2. In other embodiments, layer 2 can be omitted. The substrate may be of the n or p-type depending on the desired device to be fabricated. The substrate may further contain active device regions, wiring regions, isolation regions or other like regions (not shown). The substrate 1 may also be composed of a dielectric material such as $SiO_2$ and may be used as an isolation region of a memory device. In general, either layer 1 or 2 may be omitted; or the two layers may comprise any suitable materials or combinations as required by the specific device applications.

The channel layer 3 can comprise any semiconducting material such as Si, SiGe, SiGeC, InAs, GaAs, InP and other III/V compound semiconductors. Combinations of these semiconducting materials, strained or unstrained, are also contemplated herein. The channel layer 3 can be formed by a conventional deposition process including, for example, chemical vapor deposition (CVD), plasma-assisted CVD, evaporation or chemical solution deposition. Furthermore, the channel layer, 3, may be formed from SOI using commercial SIMOX or SMARTCUT [Bruel et al., *Jpn. J. Appl. Phys.*, "Smart Cut: a new silicon on insulator material technology based on hydrogen implantation and wafer bonding," 36 (1997) 1636-1641] processes. Typically, the channel layer 3 has a thickness of about 10 nm. It can be formed with an initial thickness between about 20 to about 100 nm, and reduced to the desired thickness thereafter.

The pad protection layer 4 can comprise an oxide, e.g. $SiO_2$, and is formed using a conventional thermal process, or may be formed by a conventional deposition process such as chemical vapor deposition (CVD), plasma-assisted CVD, sputtering, evaporation and other deposition processes. The thickness of the pad protection layer 4 may vary and is not critical to the present invention. Notwithstanding which technique is employed, the pad protection layer 4 typically has a thickness between about 2 to about 30 nm, preferably between about 5 to about 10 nm.

Figure 2:
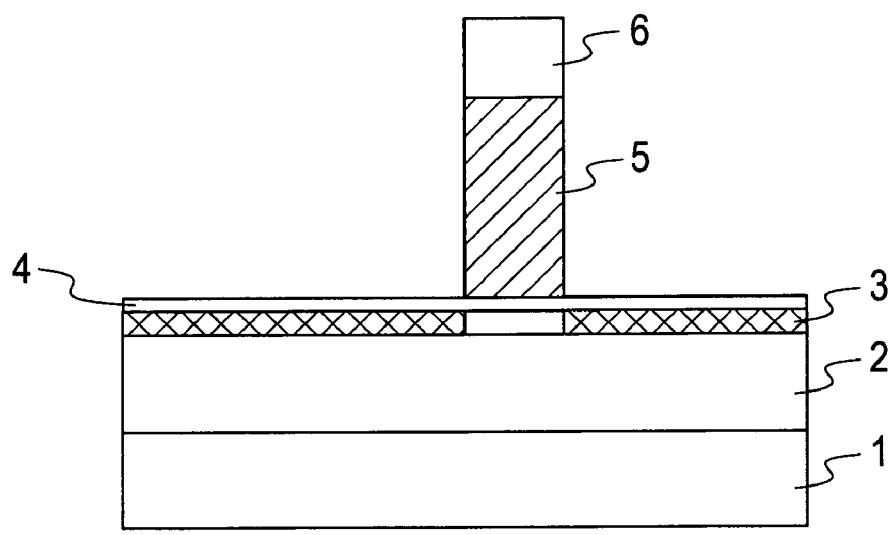

FIG. 2 shows the result of a patterning step in which a dummy gate hard mask 6 is used to pattern a dummy gate 5, or sacrificial gate, over the stacked structure of FIG. 1. This can be achieved by depositing a dummy-gate layer, e.g. comprising polysilicon, or amorphous silicon, over the structure of FIG. 1, followed by a dummy gate hard mask layer. After the dummy gate hard mask 6 is patterned using conventional lithography and reactive ion etching (RIE), the gate pattern is transferred to the underlying dummy gate layer by RIE. The pad protection layer 4 serves as an etch stop layer and protects the channel layer 3 during RIE patterning of the dummy gate 5.

In the following step, source/drain extensions, also referred to as source/drain (S/D) junctions, are formed by implanting dopants through the pad protection layer 4 into the channel layer 3, with the dummy gate 5 acting as an implantation mask. Following ion implantation, the S/D extensions are annealed to activate dopants. A channel 9 (see FIG. 3), having a predetermined channel length substantially equal to the length of the dummy gate 5, is thus defined between the S/D extensions.

Dummy-gate spacers 8 are then formed adjacent to the dummy gate 5, extending from the pad protection layer 4 up to the dummy gate hard mask 6. The dummy-gate spacers 8 can comprise an oxide or other materials that can readily be removed in a subsequent process step. In this embodiment, the dummy gate spacers 8 are of unitary construction, e.g., are present in form of a ring that surrounds the dummy gate 5. The dummy gate spacers 8 can be formed, for example, by first depositing a layer of suitable material over the structure shown in FIG. 2 (after S/D formation), followed by reactive ion etching.

Figure 3:
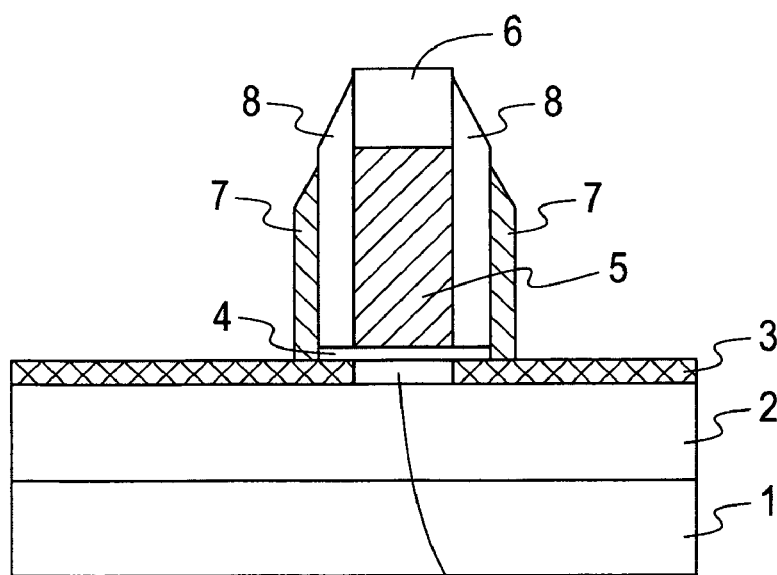

An isolating spacer structure 7 is formed flanking the dummy-gate spacers 8. The resulting structure is depicted in FIG. 3. In this embodiment, the isolating spacer structure 7 is of unitary construction, e.g., present in form of a ring that surrounds the dummy gate spacer 8. As used herein, the isolating spacer structure 7 is used to denote the isolating spacer(s), whether it is of unitary construction or not. In practice, the unitary construction is preferred because of its relative ease of fabrication. Isolating spacer structure 7 can be composed of any insulating material including, for example, an oxide, nitride, oxynitride or any combination thereof; as long as the material can be selectively etched with respect to the material of the dummy gate spacers 8. Isolating spacer structure 7 can be formed by deposition of an insulating material and subsequent etching. A preferred material would be silicon nitride.

The pad protection layer 4 is then removed, e.g., by wet chemical etching with HF, at the area around the dummy gate 5 and the dummy-gate spacers 8 to expose the channel layer 3.

In the following step, source/drain contacts 10 (see FIG. 4) are created above the source/drain extensions. This can be achieved by epitaxial growth to form the raised source/drain contacts 10 followed by implantation of a dopant such as arsenic (As) or boron (B). Thereafter the source/drain contacts 10 can be silicided. The source/drain contacts 10 are eventually composite layers with a lower silicon layer and an upper metal silicide layer.

Figure 4:
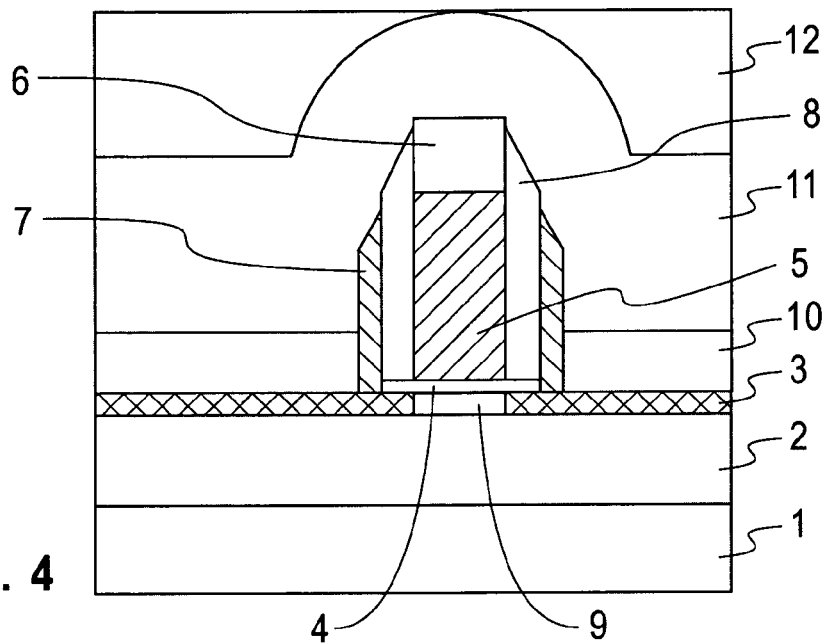

Next, a first overlayer 11 e.g., an insulating layer, exemplarily comprising silicon nitride is deposited over the whole structure, followed by deposition of a second overlayer 12, e.g. comprising oxide. The second overlayer 12 is planarized down to the first overlayer 11, e.g. by chemical mechanical planarization (CMP). No precise time control is necessary because the first overlayer 11 acts as a planarization stop layer. The result of that step is shown in FIG. 4. Note that in an alternative embodiment, the first overlayer 11 may comprise an oxide and the second overlayer 12 may comprise silicon nitride. In this latter embodiment, however, CMP of the second overlayer 12 may require time control because nitride cannot be polished selectively with respect to the underlying oxide.

Figure 5:
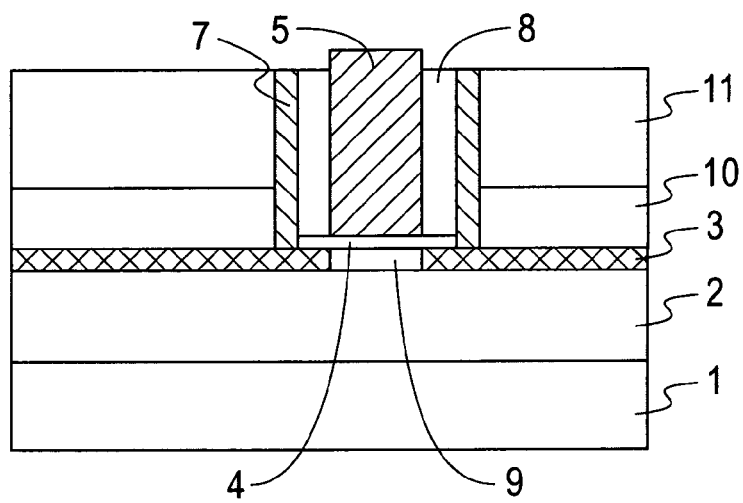

Next, the remainders of the second overlayer 12, the nitride overlayer 11, and the dummy gate mask 6 are etched down to the dummy gate 5, e.g. by means of RIE. When none of the materials used provides a natural etch stop function, this step is preferably time-controlled to stop at a desired dummy gate height. Since the RIE etch rate in polysilicon can be lower than in nitride and oxide, the dummy gate 5, if made of polysilicon, may be a little higher than the remaining part of the first overlayer 11 and of the dummy gate spacer 8. FIG. 5 shows the result of this step.

Thereafter the dummy gate 5 is removed by etching, e.g. with potassium hydroxide (KOH). The pad protection layer 4 protects the channel layer 3 and the channel 9 from the etchant.

Figure 6:
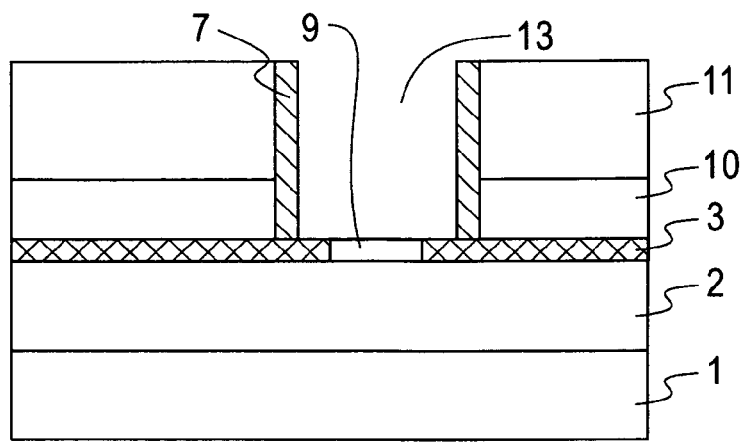

Next, the dummy gate spacer 8 is removed, e.g. using dilute HF, which also removes the pad protection layer 4, leaving behind the structure depicted in FIG. 6. The first overlayer 11 and the isolating spacer structure 7 can comprise silicon nitride which is resistant to HF. Generally the isolating spacer structure 7 serves to protect the source/drain contacts 10 from the etchant used to remove the dummy gate spacer 8. However, if the material of the S/D contacts 10 is resistant to the etchant used for removing the dummy gate spacer 8, spacers 7 will not be necessary.

As shown in FIG. 6, the channel layer 3 and the isolating spacers 7 together define a cavity 13. In the absence of the optional isolating spacer structure 7, the cavity 13 will be defined at its bottom by channel layer 3 and at its sidewalls by side surfaces of S/D contacts 10 and the overlayer 11. It can be seen that the length of channel 9 is shorter than the distance between nitride spacers 7. In this process, the dummy gate 5 is used as a sacrificial feature to help define the channel length, while the dummy gate spacers 8 allows the cavity 13 to be defined with a bottom lateral dimension greater than the channel length. The cavity 13 is typically, but not necessarily, a high-aspect ratio aperture. The term "high-aspect ratio gate aperture" is used herein to denote a cavity 13 whose height to width ratio (H/W) is about 2 or greater.

At this stage, an optional sacrificial oxide layer can be grown on the channel layer 3 and channel 9 within the cavity 13 in order to produce a cleaner surface for the next step. The sacrificial oxide layer furthermore serves to make the channel 9 thinner since growth not only adds material on top of the channel 9 and channel layer 3 but also extends into the channel 9 and channel layer 3. The sacrificial oxide layer is then removed, e.g., by selective etching, leaving behind a cleaner and thinned-down channel 9 and channel layer 3 at the bottom of the cavity 13. This results in a "recessed" portion of the channel layer 3 that is thinner than the remaining channel layer lying outside the cavity 13.

Figure 7:
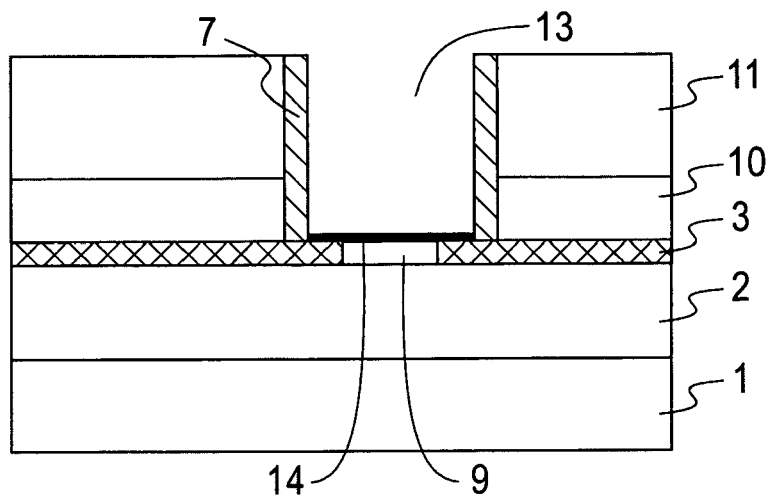

An optional gate-isolating layer 14 can then be formed at the bottom of the cavity 13, as shown in FIG. 7. The gate-isolating layer 14 acts as a buffering layer between channel 9 and the dielectric material to be deposited thereon. A preferred material for the gate-isolating layer 14 is silicon oxide, which can be thermally grown, and thinned if necessary. Other materials, however, may also be suitable. This gate-isolating layer, for example, is used to prevent mobility degradation in the silicon channel that may be caused by scattering mechanisms in the dielectric layer.

Figure 8:
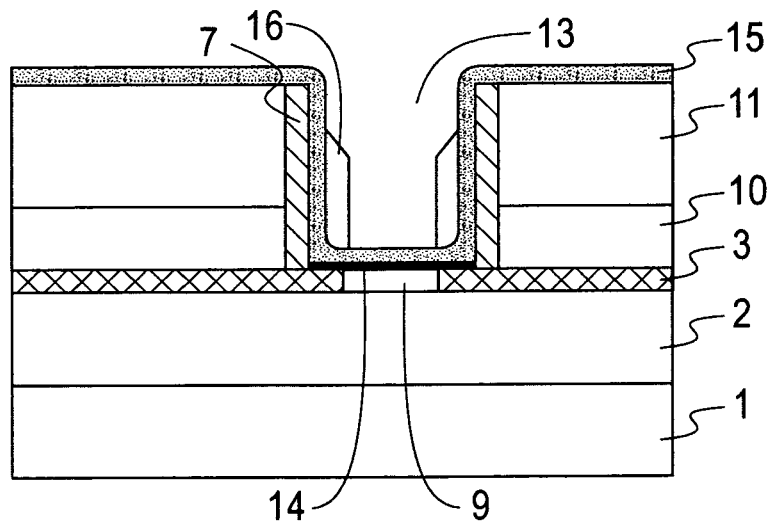

Thereafter a dielectric layer 15, preferably comprising a high-K dielectric material, is deposited. As shown in FIG. 8, the dielectric layer 15 covers the nitride overlayer 11, the walls of the isolating spacers 7 and the gate-isolating layer 14. A high-K material is a material that exhibits a dielectric constant of approximately above 10 or more. Examples of such materials, include, but are not limited to hafnium oxide, hafnium silicate, aluminum oxide or zirconium oxide.

If a gate were to be formed at this stage of the process, as typically done in conventional methods, there would be two disadvantages: First, the parasitic capacitance between the gate and the source/drain extensions in the channel layer 3 would be too high. Second, the dielectric layer, due to the nature of its deposition process exhibits rounded edges at the area where the dielectric layer transits from the plane above the gate-isolating layer 14 to the plane adjacent the isolating spacer structure 7. These rounded edges would lead to an increased thickness of the dielectric layer 15, between the source/drain extensions and the gate edge, resulting in diminished gate control over the channel 9, whereby the on-resistance of the FET would increase and the sub-threshold swing would degrade. The device performance would be degraded since only the center of the gate would have full control of the channel.

Thus, according to the present invention, "internal" gate spacers 16, or more generally, a gate spacer structure, is formed inside the cavity 13, as shown in FIG. 8. This can be achieved, for example, by depositing a spacer material, e.g. an oxide or other suitable material, in the cavity 13 and etching the deposited material anisotropically, e.g. by RIE, such that the portion of the dielectric layer 15 above channel 9 is exposed, leaving the gate spacer structure 16 on the sidewalls of the cavity 13. This arrangement of the gate spacer structure 16 provides a narrowing of the cavity 13 above the channel 9. The gate spacer structure 16 has an internal surface 16S (i.e., surface facing the interior of the cavity 13, away from the cavity sidewalls) with a lower portion that is substantially perpendicular to the dielectric layer 15. In other words, the internal surface 16S contacts or meets the dielectric layer 15 at the bottom of the cavity 13 at about a right angle, although some deviation from perpendicular, e.g., smaller or larger angles, are also possible. A large re-entrant profile, however, will not be preferred. The etching process for the gate spacer structure 16 is selective with respect to dielectric layer 15. It can be seen that the gate spacer structure 16 shown here is of unitary construction, e.g., present in form of a ring that is embedded within the cavity 13. In principle, the gate spacer structure 16 may also be formed as two separate spacers, although it may involve a more complicated fabrication process.

Figure 9:
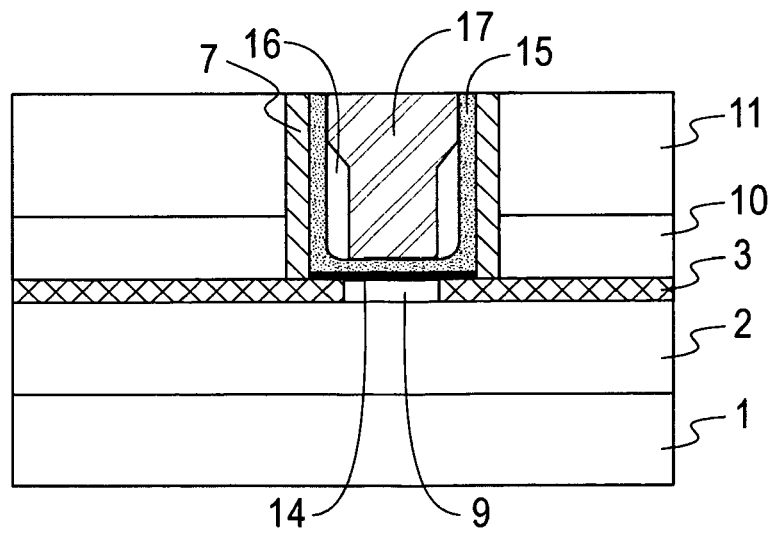

Thereafter the cavity 13 is filled with a conductive material to form a gate 17. This can be done by depositing the material into the cavity 13 and onto the dielectric layer 15. For example, the conductive material may be formed from vapor phase deposition, such as tungsten or titanium nitride, or by depositing amorphous silicon and reacting it with a metal such as nickel to form a silicide, and subsequently thinning it down to the dielectric layer 15, and possibly removing the conductive material and the dielectric layer 15 lying outside of cavity 13, e.g., by CMP. Polysilicon may also be used, for example, either in-situ doped or doped by a conventional ion-implantation and annealing technique, as long as the annealing temperatures and conditions are compatible with the dielectric layer 15 and the second overlayer 11. The resulting device is depicted in FIG. 9. Not only is channel 9 shorter than the distance between the isolating spacers 7 and is substantially aligned laterally with the bottom of the gate 17, but the profile of the lower portion of gate 17 at its interface to the dielectric layer 15 is also improved. Specifically, there are no rounded corners in the region where the gate spacers 16, the dielectric layer 15 and the bottom of the gate 17 meet. Instead, the lower portion of gate 17 and the dielectric layer 15 meet at a relatively sharp "edge" as defined by the internal spacer structure 16, and are substantially perpendicular to each other. This provides a better control from the gate 17 to the channel 9.

In general, many different conductive materials can be used for gate 17, including, for example, elemental metals such as tungsten, rhenium, tantalum, hafnium, molybdenum, aluminum, lanthanum; metal nitrides such as titanium nitride, tantalum nitride, tungsten nitride, tantalum silicon-nitride; various silicided gates (with and without dopants for threshold voltage control); and conducting metal oxides, provided that they are compatible with the desired process.

Figure 10:
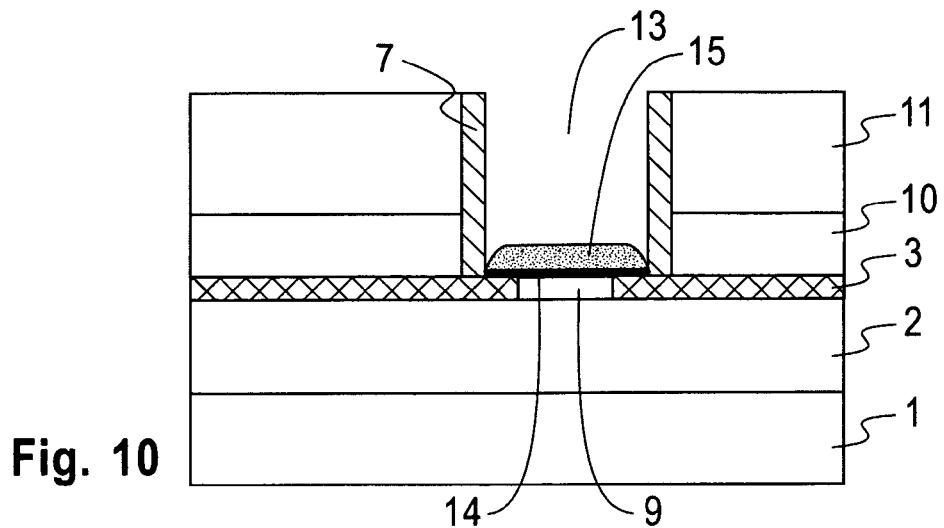
Figure 11:
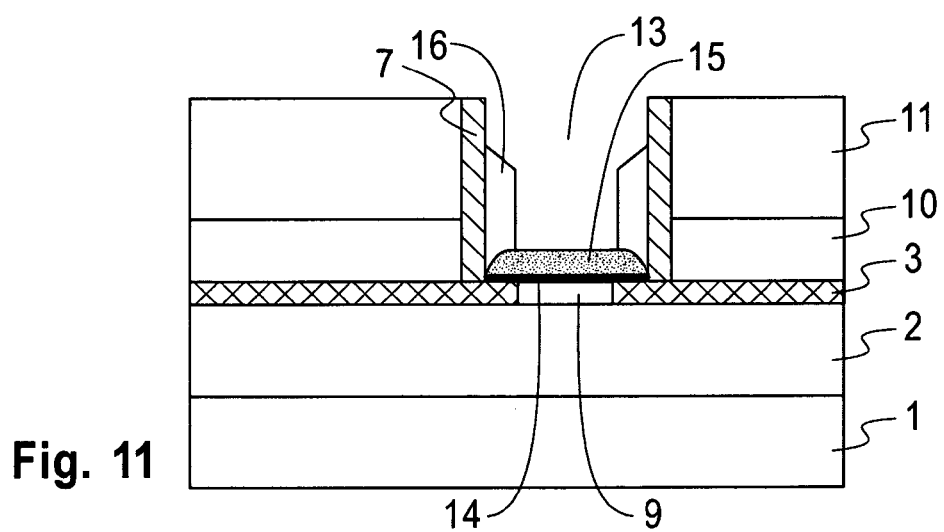
Figure 12:
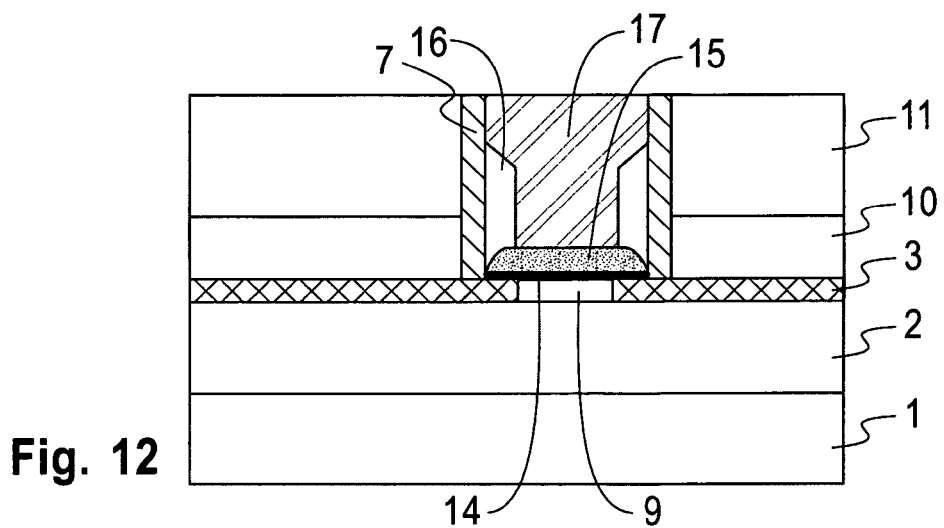

FIGS. 10-12 show an alternative process sequence that can be used to form the gate with internal gate spacers. In this embodiment, the structure of FIG. 7 is subjected to a deposition step in which the dielectric layer 15 is formed only on the gate-isolating layer 14 at the bottom of the cavity 13. This can be achieved, for example, by a directional deposition process such as thermal evaporation of a metal such as hafiium, zirconium, aluminium, among others, and subsequent chemical conversion to a high-K dielectric such as metal oxides, silicates or other appropriate high-K materials, allowing a further reduction in sidewall capacitance. As shown in FIG. 10, the dielectric layer 15 covers only the bottom of the cavity 13. However, the problem still exists that the edge where the dielectric layer 15 meets the isolating spacer structure 7 may not be well defined, and is rounded either upwards or downwards (e.g., similar to a cusp), which would lead to, in the first case, reduced control between the gate to be formed and the channel 9, and in the second case a danger of a short between the gate to be formed and the channel 9.

Thus, as shown in FIG. 1, internal gate spacer structure 16 is formed within cavity 13, as previously described in connection with FIG. 8. Here the gate spacer structure 16 contacts both the dielectric layer 15 and the isolating spacer structure 7. In other embodiments where the isolating spacer structure 7 is absent, the gate spacer structure 16 will contact the overlayer 11 instead.

Thereafter the cavity 13 is filled with a conductive material to form the gate 17, as previously described. The resulting device is depicted in FIG. 12. Again, by means of the gate spacer structure 16, the interface between the bottom of the gate 17 and the dielectric layer 15 is better defined and offers a better control over the channel 9. As previously discussed, the isolating spacer structure 7 and gate isolating layer 14 are optional, and either one or both may be omitted in alternative embodiments.

Figure 13:
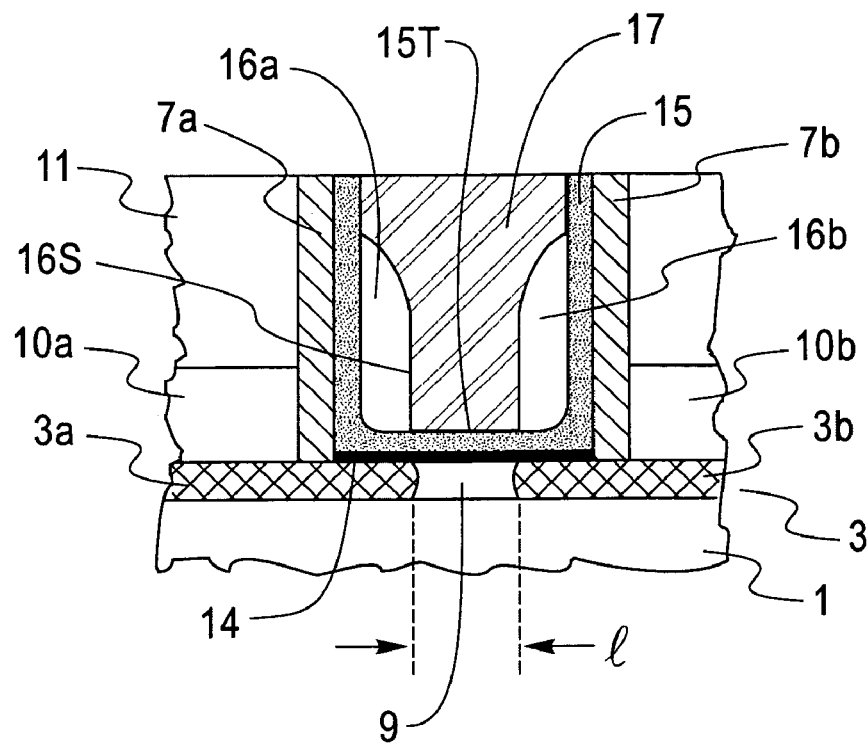

FIG. 13 shows an enlarged view of the device of FIG. 9, with different reference labels designating the source-side and drain-side elements. Channel layer 3 is disposed over substrate 1, and comprises channel 9, source extension 3a and drain extension 3b. Channel 9 is characterized by a channel length (1) in the lateral direction. Source contact 10a and drain contact 10b are provided to contact the source extension 3a and drain extension 3b, respectively.

The gate-isolating layer 14 is disposed over channel layer 3, and dielectric layer 15 is disposed over the gate-isolating layer 14. In other embodiments, the gate-isolating layer 14 may be omitted. In the embodiment of FIG. 13, dielectric layer 15 has a U-shaped cross-section, with substantially vertical sidewall portions and a horizontal portion having a top surface 15T. The internal gate spacer structure, shown as 16a and 16b, is disposed over a peripheral area of the top surface 15T of the dielectric layer 15. Note that the rounded edges or profiles between the horizontal portion and vertical sidewalls of the dielectric layer 15 are covered by the internal spacer structure 16a and 16b, which has an internal surface 16S (away from the dielectric layer 15) whose lower portion is substantially vertical or perpendicular to the top surface 15T of the dielectric layer 15. In this case, the internal spacer structure 16a and 16b also contacts the vertical sidewall portions of the U-shaped dielectric layer 15. In this embodiment, the internal surface 16S is a curved surface, e.g., with a curved region towards the top. Other variations are also possible, depending on the specific process steps used. For example, the internal spacer 16a and 16b may also have a rectangular cross-section, e.g., by polishing or removing the upper curved region to form a horizontal portion of the internal surface.

The volume between spacer structure 16a, 16b and between the opposite sidewalls of the dielectric layer 15 is filled with a suitable gate material, resulting in gate 17 having a lower portion surrounded by the gate spacer structure 16a, 16b and an upper portion surrounded by the dielectric layer 15. The gate 17 has a lateral dimension at its bottom that is at least equal to the channel length, and substantially aligned with channel 9 (i.e., substantially laterally aligned with the edges of the S/D extensions). In this device, the spacer structure 16a, 16b effectively confines the bottom or lower portion of gate 17 to contact a "non-peripheral" portion of the dielectric layer 15, such that a better defined, e.g., sharper, edge between the bottom of gate 17 and the top surface 15T of dielectric layer 15 is achieved (instead of rounded corners as obtained in conventional devices). The bottom profile of this gate contact allows improved channel control of the device.

As shown in FIG. 13, the lateral dimension at the top of the gate 17 is greater than the lateral dimension of the bottom of the gate 17 by the total width of the internal gate spacer structure 16a, 16b that is measured along the direction of the channel, or the direction connecting the source extension 3a to the drain extension 3b, and at a vertical height at which the inner and outer sidewalls of the U-shaped dielectric layer 15 and the inner and outer sidewalls of internal gate spacer structure 16a, 16b are substantially vertical. The source and drain contacts 10a and 10b are isolated from the dielectric layer 15 by means of an isolating spacer structure (shown as 7a on the source side and 7b on the drain side). As previously discussed, the use of the isolating spacer structure 7 is optional and, depending on the materials used for the source and drain contacts 10a and 10b and specific process conditions, may be omitted.

After this structure is formed, usual middle-end and back-end of the line processes can be done including back gate contact formation.

Figure 14:
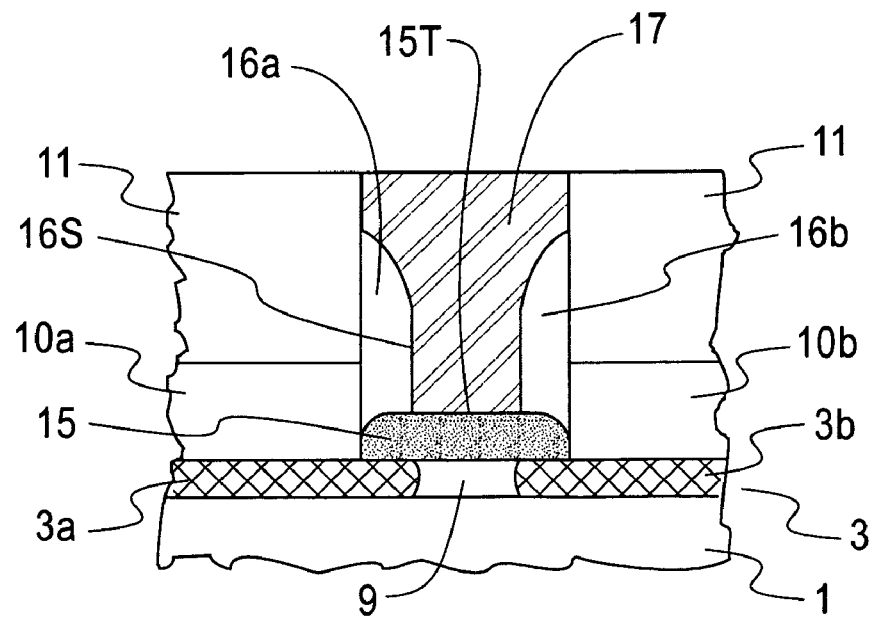

-FIG. 14 shows an alternative device structure in which the dielectric layer 15 is formed only at the bottom of the cavity 13 (see discussion in connection with FIGS. 10-12), and both the gate isolating layer 14 and isolating spacer 7 are omitted.

The lateral dimension at the top of the gate 17 is greater than the lateral dimension of the bottom of the gate 17. In this embodiment, the gate spacer structure 16a, 16b is also adjacent to, and in contact with, all of the source contact, the drain contact and the overlayer 11.

Although the present invention shows the formation of one FET structure, the formation of a plurality of such FET structures on a single substrate is also contemplated.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Any disclosed embodiment may be combined with one or several of the other embodiments shown and/or described. This is also possible for one or more features of the embodiments.

It is understood that a person skilled in the art can modify the shown arrangements in many ways without departing from the gist of the invention which is encompassed by the subsequent claims.

The invention claimed is:

1. A MOSFET comprising:
   a source extension;
   a drain extension;
   a channel between said source extension and said drain extension;
   a dielectric layer located above said channel and having rounded edges on a peripheral portion, wherein said dielectric layer is thinner at said rounded edges than at a non-peripheral portion;
   a gate spacer structure disposed on said peripheral portion of a top surface of said dielectric layer and having an internal surface that meets said top surface at about a right angle, wherein said gate spacer structure is adjacent to said source and drain contacts; and
   a gate disposed on said non-peripheral portion of said top surface of said dielectric layer and having at least a lower portion surrounded by and in contact with said internal surface of said gate spacer structure; and said gate is substantially aligned at its bottom with said channel and said gate spacer structure has an internal surface abutting the gate that has a curved upper portion that extends to an upper portion of an external vertical surface, and said gate spacer structure does not extend to an upper surface of the gate.

2. The MOSFET of claim 1, wherein said dielectric layer comprises a material with a dielectric constant greater than about 10.

3. The MOSFET of claim 1, further comprising:
   a source contact disposed on said source extension;
   a drain contact disposed on said drain extension; and
   an isolating spacer structure separating said dielectric layer from said source contact and said drain contact.

4. The MOSFET of claim 1, further comprising an isolating spacer structure abutting and surrounding an upper portion of said gate.

5. The MOSFET of claim, further comprising:
   a source contact disposed on said source extension; and
   a drain contact disposed on said drain extension, wherein said isolating spacer structure laterally abuts said source contact and said drain contact.

6. The MOSFET of claim 1, further comprising:
   a source contact disposed on said source extension; and a drain contact disposed on said drain extension, wherein said gate further has an upper portion surrounded by an insulating layer disposed over said source contact and said drain contact.

7. The MOSFET of claim 1, further comprising a gate-isolating layer between said channel and said dielectric layer.

8. The MOSFET of claim 1, further comprising an insulating layer having a top surface that is coplanar with said upper surface of said gate.

9. The MOSFET of claim 8, wherein an entirety of said upper surface of said gate is coplanar with said top surface of said insulating layer.

10. The MOSFET of claim 1, wherein said gate spacer structure abuts said rounded edges.

11. A MOSFET comprising:
   a source extension;
   a drain extension;
   a channel between said source extension and said drain extension;
   a dielectric layer having rounded edges on a peripheral portion, wherein said dielectric layer is thinner at said rounded edges than at a non-peripheral portion;
   an internal gate spacer structure disposed over a peripheral area of said top surface of said horizontal portion of said dielectric layer; and
   a gate disposed on a portion of said top surface and adjoins said internal gate spacer structure.

12. The MOSFET of claim 11, wherein said internal gate spacer structure does not extend to an upper surface of said gate, and wherein said gate is wider at an upper portion above said internal gate spacer than at a lower portion surrounded by said internal gate spacer.

13. The MOSFET of claim 11, further comprising:
   a source contact disposed on said source extension;
   a drain contact disposed on said drain extension; and
   an isolating spacer structure separating said dielectric layer from said source contact and said drain contact.

14. The MOSFET of claim 11, further comprising a gate-isolating layer between said channel and said dielectric layer.

15. The MOSFET of claim 11, wherein said dielectric layer comprises a material with a dielectric constant greater than about 10.

16. The MOSFET of claim 11, further comprising:
   a source contact disposed on said source extension;
   a drain contact disposed on said drain extension; and
   an isolating spacer structure abutting and surrounding an upper portion of said gate and disposed between said dielectric layer and said source contact and said drain contact.

17. The MOSFET of claim 11, further comprising:
   a source contact disposed on said source extension;
   a drain contact disposed on said drain extension; and
   an insulating layer laterally abutting and surrounding an upper portion of said gate and disposed over said source contact and said drain contact.

18. The MOSFET of claim 11, wherein said dielectric layer is without a vertical sidewall portion and has a horizontal portion having a top surface.

19. The MOSFET of claim 11, further comprising an insulating layer having a top surface that is coplanar with said upper surface of said gate.

20. The MOSFET of claim 11, wherein said gate spacer structure abuts said rounded edges.

* * * * *